US010833566B2

(12) United States Patent
Chang et al.

(10) Patent No.: US 10,833,566 B2
(45) Date of Patent: Nov. 10, 2020

(54) INVERTER INTEGRATED MOTOR

(71) Applicant: Chicony Power Technology Co., Ltd., New Taipei (TW)

(72) Inventors: Meng-Fang Chang, New Taipei (TW); Yu-Chia Ting, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/128,511

(22) Filed: Sep. 12, 2018

(65) Prior Publication Data

US 2020/0014285 A1 Jan. 9, 2020

(30) Foreign Application Priority Data

Jul. 9, 2018 (TW) .............................. 107123726 A

(51) Int. Cl.
*H02K 11/33* (2016.01)
*H02K 5/20* (2006.01)
(Continued)

(52) U.S. Cl.
CPC ................ *H02K 11/33* (2016.01); *H02K 5/20* (2013.01); *H02K 9/18* (2013.01); *H05K 7/209* (2013.01);
(Continued)

(58) Field of Classification Search
CPC ........ H02K 1/32; H02K 5/18–20; H02K 5/12; H02K 5/24; H02K 9/02; H02K 9/04;
(Continued)

(56) References Cited

U.S. PATENT DOCUMENTS 2,196,952 A * 4/1940 Bogaty ................... H02K 9/06
310/62
2,309,583 A * 1/1943 Frantz ....................... A47L 5/12
15/344
(Continued)

FOREIGN PATENT DOCUMENTS

CN 201526476 U 7/2010
CN 102771035 A 11/2012
(Continued)

OTHER PUBLICATIONS

Office Action dated Feb. 14, 2019 of the corresponding Taiwan patent application No. 107123726.
(Continued)

*Primary Examiner* — Zachary Pape
*Assistant Examiner* — Amir A Jalali
(74) *Attorney, Agent, or Firm* — Chun-Ming Shih; HDLS IPR Services

(57) ABSTRACT

An inverter integrated motor having a frame, a motor body, a cap, a fan, an inverter, and a heat transfer module is provided. The motor body is received in the frame, and a heat dissipation passage is formed between them, the motor body is covered and closed by the cap, and the cap and the motor body are presented in a continuous form. The inverter is attached on an outer side surface of the frame. The heat transfer module is located between the cap and the fan and thermally connected to the inverter. Airflow is generated by the fan to flow through the heat transfer module and exchange heat therewith, and the airflow then flows into the heat dissipation passage along the cap. Accordingly, an attached additional fan for the inverter is not necessary.

18 Claims, 9 Drawing Sheets

(51) Int. Cl.
*H02K 9/18* (2006.01)
*H05K 7/20* (2006.01)

(52) U.S. Cl.
CPC ..... *H05K 7/20336* (2013.01); *H05K 7/20409* (2013.01); *H05K 7/20909* (2013.01)

(58) Field of Classification Search
CPC ........ H02K 9/06; H02K 9/18–22; H02K 9/24; H02K 11/00; H02K 11/33
USPC ...... 361/697; 417/410.1, 423.8, 423.14, 366, 417/438; 310/88, 52, 54, 58, 64, 89, 310/67 R, 68 D
See application file for complete search history.

(56) References Cited

U.S. PATENT DOCUMENTS

| | | | | |
|---|---|---|---|---|
| 2,321,126 | A * | 6/1943 | Breuer | F04D 25/082 417/367 |
| 2,822,123 | A * | 2/1958 | Cole | H02K 9/24 417/423.2 |
| 4,518,325 | A * | 5/1985 | Kingston | A61H 33/028 417/368 |
| 5,073,736 | A * | 12/1991 | Gschwender | F04D 13/06 310/43 |
| 5,592,716 | A * | 1/1997 | Moren | A47L 9/22 15/412 |
| 5,912,541 | A | 6/1999 | Bigler et al. | |
| 6,229,232 | B1 * | 5/2001 | Roth-Stielow | H02K 5/225 310/160 |
| 6,704,202 | B1 * | 3/2004 | Hamaoka | F25D 23/006 361/690 |
| 8,506,264 | B2 * | 8/2013 | Horng | F04D 25/0606 310/52 |
| 9,048,709 | B2 | 6/2015 | Chang | |
| 9,287,747 | B2 * | 3/2016 | Balzer | H02K 5/20 |
| 2005/0082158 | A1 * | 4/2005 | Wenger | F28D 15/0266 202/155 |
| 2010/0051236 | A1 * | 3/2010 | Lin | B21D 53/06 165/104.21 |
| 2012/0002373 | A1 * | 1/2012 | Kitajima | F28D 15/0275 361/717 |
| 2012/0235421 | A1 * | 9/2012 | Wong | F03D 80/60 290/55 |
| 2012/0294109 | A1 * | 11/2012 | Boozer | B01F 15/00772 366/206 |
| 2013/0026866 | A1 * | 1/2013 | Morisaki | H02K 5/08 310/51 |
| 2013/0076172 | A1 * | 3/2013 | Koyama | H02K 9/06 310/63 |
| 2013/0076174 | A1 * | 3/2013 | Wibben | H02K 9/14 310/64 |
| 2013/0119793 | A1 * | 5/2013 | Hofkirchner | H02K 5/20 310/54 |
| 2013/0162190 | A1 * | 6/2013 | Smith | H02P 31/00 318/490 |
| 2014/0009016 | A1 * | 1/2014 | Seidenbinder | H01L 25/16 310/64 |
| 2014/0300221 | A1 * | 10/2014 | Linnemann Nielsen | H02K 5/225 310/54 |
| 2014/0361648 | A1 * | 12/2014 | Shirakata | H02K 11/046 310/52 |
| 2016/0006325 | A1 * | 1/2016 | Grabner | H02K 9/06 310/62 |
| 2016/0134177 | A1 * | 5/2016 | Itoh | H02K 9/12 105/59 |
| 2017/0279337 | A1 * | 9/2017 | Komura | H02K 5/20 |
| 2017/0310187 | A1 * | 10/2017 | Becerra | H02K 9/22 |
| 2017/0331345 | A1 * | 11/2017 | Wettlaufer | H02K 9/16 |
| 2018/0209406 | A1 * | 7/2018 | Rosinski | F04B 17/03 |
| 2018/0262090 | A1 * | 9/2018 | Nakazawa | H02K 9/04 |
| 2018/0262094 | A1 * | 9/2018 | Blankemeier | H02K 9/06 |
| 2018/0309341 | A1 * | 10/2018 | Pokorny | H01R 13/521 |
| 2019/0101132 | A1 * | 4/2019 | Fujiwara | F04D 29/5813 |

FOREIGN PATENT DOCUMENTS

| | | |
|---|---|---|
| CN | 104170220 A | 11/2014 |
| CN | 103683685 B | 9/2016 |
| CN | 104283373 B | 11/2016 |
| CN | 106936252 A | 7/2017 |
| CN | 206432856 U | 8/2017 |
| CN | 104460359 B | 4/2018 |
| DE | 112011100372 T5 | 12/2012 |
| EP | 1968170 B1 | 11/2012 |
| EP | 2086093 B1 | 2/2014 |
| JP | H11234954 A | 8/1999 |
| JP | 2005-94949 A | 4/2005 |
| JP | 2014064345 A | 4/2014 |
| TW | 200906033 A | 2/2009 |
| TW | M435779 U | 8/2012 |
| WO | 2017/208675 A1 | 12/2017 |

OTHER PUBLICATIONS

Office Action dated May 31, 2019 of the corresponding German patent application No. 102018123796.0.

* cited by examiner

INVERTER INTEGRATED MOTOR

TECHNICAL FIELD

The present invention relates to an inverter integrated motor and, in particular, to an inverter integrated motor with a simplified inverter heat dissipation structure.

BACKGROUND

A three-phase AC induction motor is one of the commonly-used driving power output devices. As power is "on" or "off", the three-phase AC induction motor is turned on or turned off. However, reference values such as a voltage-to-frequency ratio, a carrier frequency ratio, rotation speed cannot be changed. Therefore, to make the motor operate more stably and increase operation efficiency, an inverter as a driving device is used to collaborate with the three-phase AC induction motor. The inverter is often incorporated into a power control cabinet and is electrically connected to the motor via circuits. In general, the motor is in the factory, but the power control cabinet is outside the factory. As a result, this configuration needs a large amount of wiring material and consumes considerable time for arranging the wiring.

The concept of an integrate motor drive (IMD) system integrates the motor and the inverter, thereby reducing the number of components and decreasing installation complexity for the motor and the driving system. Hence, the forgoing disadvantages are overcome. The motor generates a large amount of heat during operation. A coaxially connected fan is used to dissipate the heat, but the inverter also needs an additional fan to dissipate its heat, so it is hard to reduce the size of a conventional IMD heat dissipation structure. Besides, the additional fan needs a controller and consumes extra power.

In view of this, the inventor studied various technologies and created an effective solution in the present disclosure.

SUMMARY

The present invention provides an inverter integrated motor which simplifies a heat dissipation structure for an inverter.

The present invention relates to an inverter integrated motor. The inverter integrated motor includes a frame, a motor body, a cap, a fan, an inverter, and a heat transfer module. The motor body is received in the frame. The motor body includes a casing disposed inside the frame and includes a rotation shaft inserted through the casing. The casing is spaced apart from the frame. A heat dissipation passage is formed inside the casing. Two ends of the rotation shaft from an output shaft and a connection shaft inserted through the casing respectively. The cap receives the connection shaft. The cap covers and closes the casing. The cap and the casing are presented in a continuous form. The fan is arranged on the connection shaft and driven by the rotation shaft. The inverter is disposed on an outer side surface of the frame. The inverter includes a motor control circuit board. The heat transfer module is disposed between the cap and the fan and is thermally connected to the motor control circuit board. The motor control circuit board transfers heat to between the cap and the fan by means of the heat transfer module. Airflow is generated by the fan to flow through the heat transfer module and exchange heat therewith, and then the airflow flows along an outer surface of the cap to enter the heat dissipation passage.

In the inverter integrated motor of the present invention, the heat transfer module and the cap can be connected in an integral form. Alternatively, the heat transfer module and the cap can be separated from each other, and a thermal break gap is formed between the heat transfer module and the cap.

In the inverter integrated motor of the present invention, the heat transfer module includes a thermal conductive base connected to the frame and thermally connected to the motor control circuit board. The heat transfer module also includes a plurality of fins extended from the thermal conductive base to between the cap and the fan. The fins are arranged parallel to each other. The fins gradually taper and extend to fit the conical shape of the cap. An end portion of each fin extends but does not cross the rotation shaft. The fins surround the rotation shaft. Each fin can extend to the cap and can be connected to the cap in an integral form. Alternatively, each fin can be separated from the cap, and a thermal break gap is formed between the end portion of each fin and the cap. The cap is of conical shape gradually tapering and extending from the casing toward the fan. An air compressing passage communicating with the heat dissipation passage is formed between the cap and the thermal conductive base. The fins are received in the air compressing passage.

In the inverter integrated motor of the present invention, a transistor is disposed on the motor control circuit board. A position where the heat transfer module is connected to the motor control circuit board is arranged corresponding to the transistor. The heat transfer module includes a heat diffusion assembly. The heat diffusion assembly is connected between the thermal conductive base and the transistor. The heat diffusion assembly extends along a surface of the thermal conductive base. The heat diffusion assembly can include a metal sheet. Two sides of the metal sheet are connected to the thermal conductive base and the transistor, respectively. The heat diffusion assembly includes a vapor chamber. The sides of the vapor chamber are connected to the thermal conductive base and the transistor. The heat diffusion assembly can include a heat pipe. The heat pipe includes an evaporation section, and the transistor is thermally connected to the evaporation section. The evaporation section of the heat pipe is the middle section of the heat pipe. Two ends of the heat pipe form two condensation sections respectively, and the two condensation sections are connected to the thermal conductive base.

In the inverter integrated motor of the present invention, a plurality of fins is extended from an outer side of the casing, and the fins are spaced apart from each other and disposed inside the heat dissipation passage. The fins on the casing can extend to connect the fins of the heat transfer module. A plurality of stators inside the casing surround the rotation shaft, the stators are in contact with an inner surface of the casing and thermally connected to the fins on the outer side of the casing.

The inverter integrated motor includes a heat transfer module. By using the heat transfer module, the heat from the inverter at one side of the motor body is transferred to a passage where the airflow of the fan passes. Consequently, there is no need to include another fan attached corresponding to the inverter.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1:
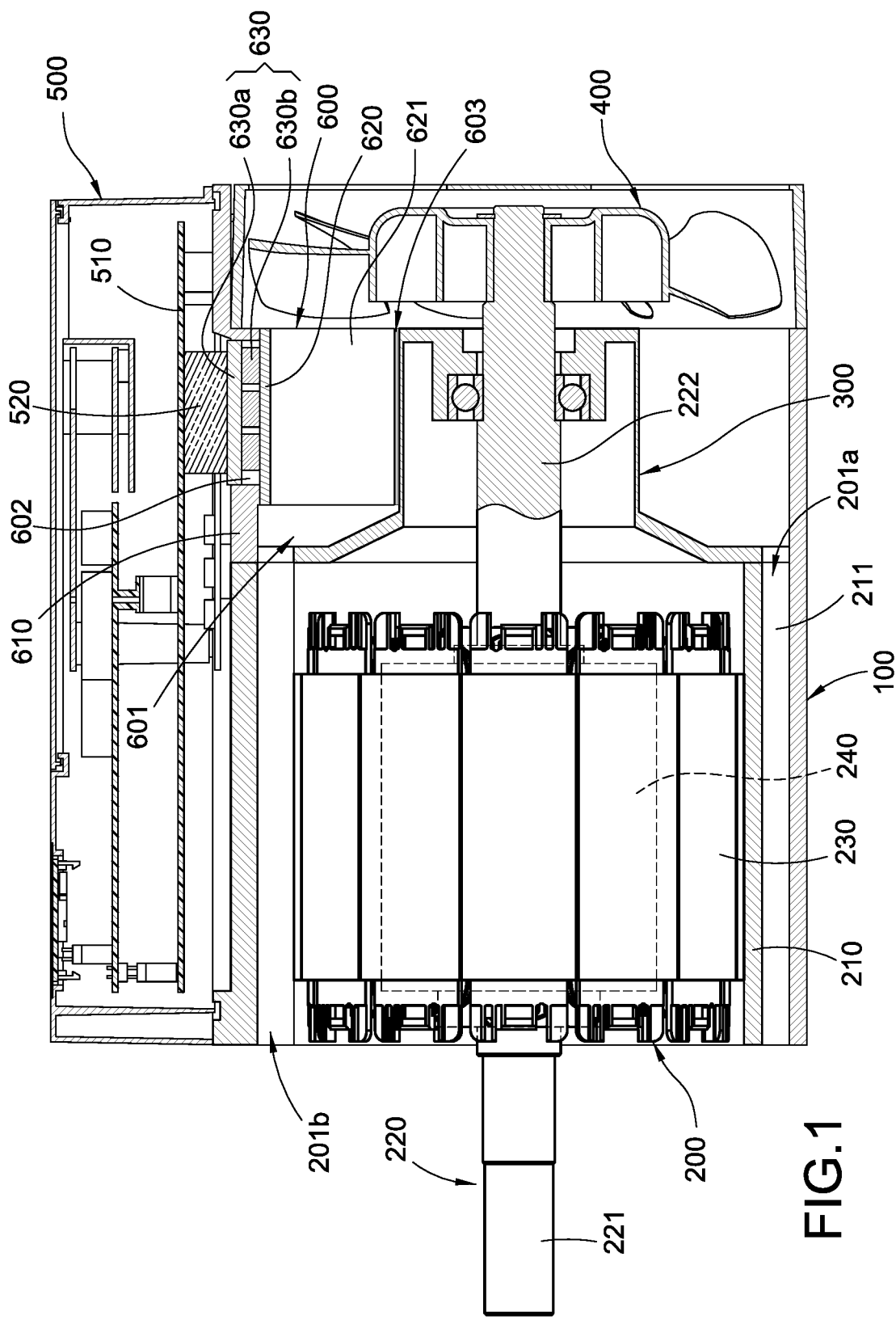
FIGS. 1 and 2 are schematic views illustrating an inverter integrated motor according to the first embodiment of the present invention.
Figure 2:
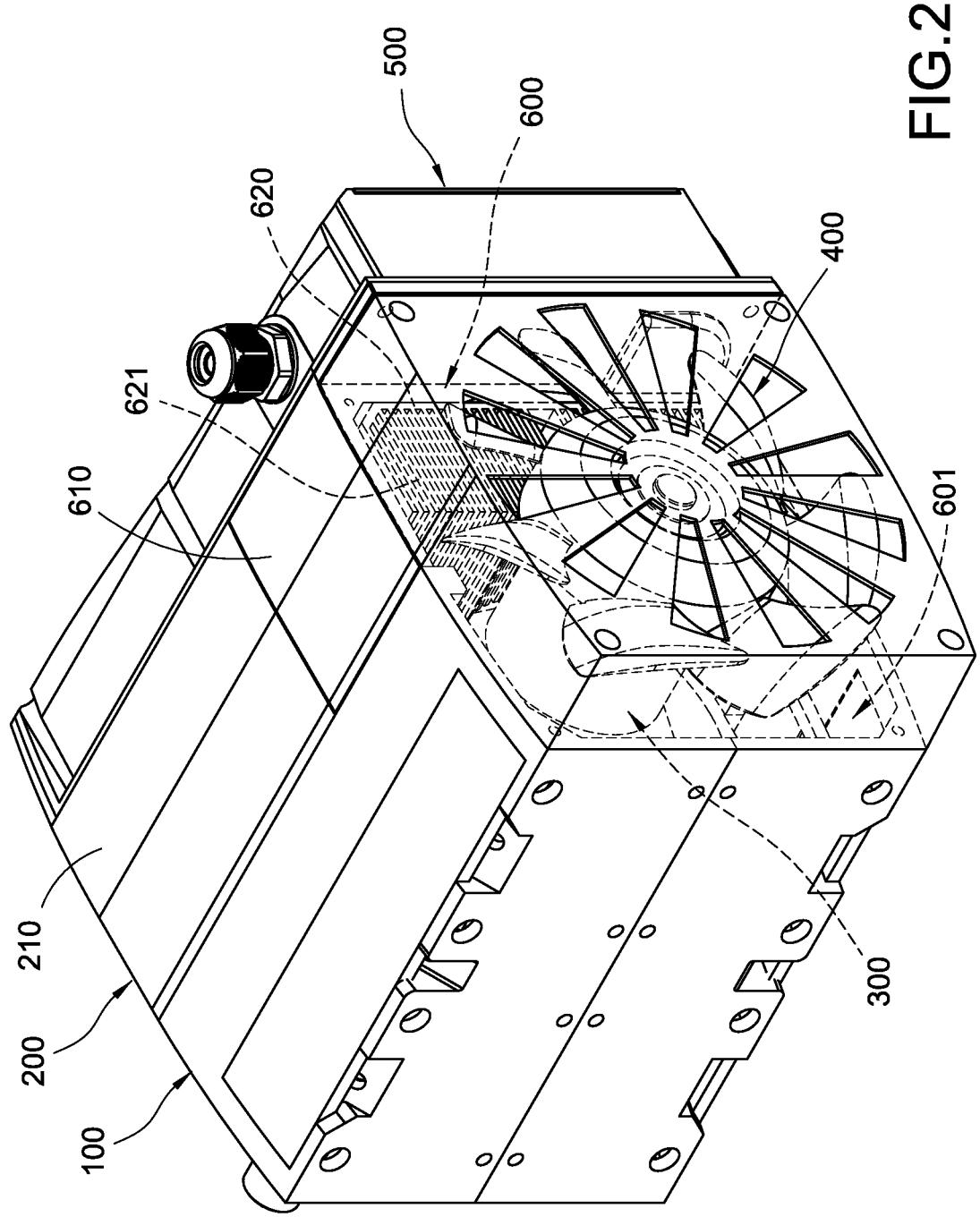
Figure 3:
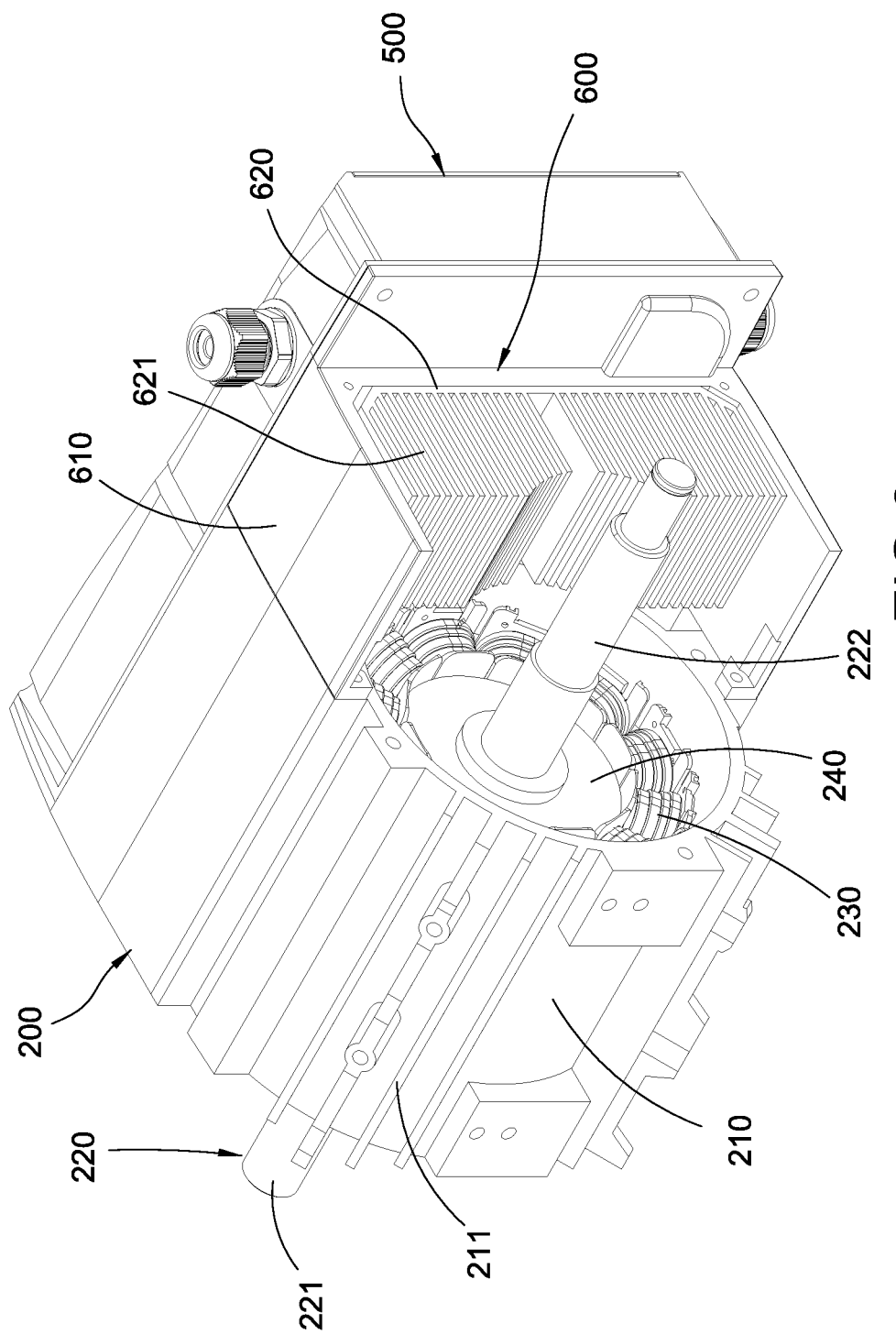
FIG. 3 is a perspective view illustrating a partial structure of the inverter integrated motor according to the first embodiment of the present invention.
Figure 4:
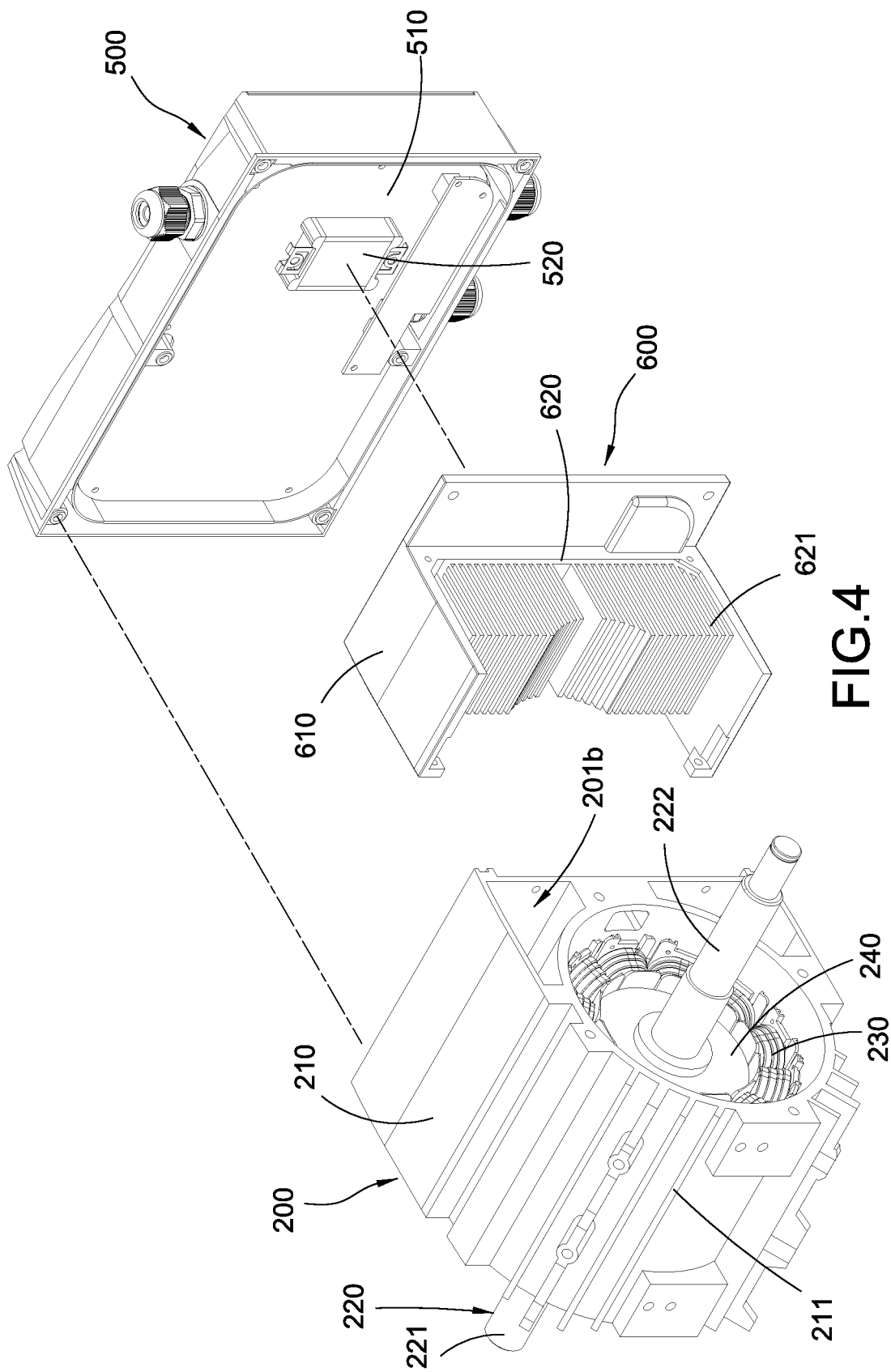
FIG. 4 is a perspective exploded view illustrating a partial structure of the inverter integrated motor according to the first embodiment of the present invention.
Figure 5:
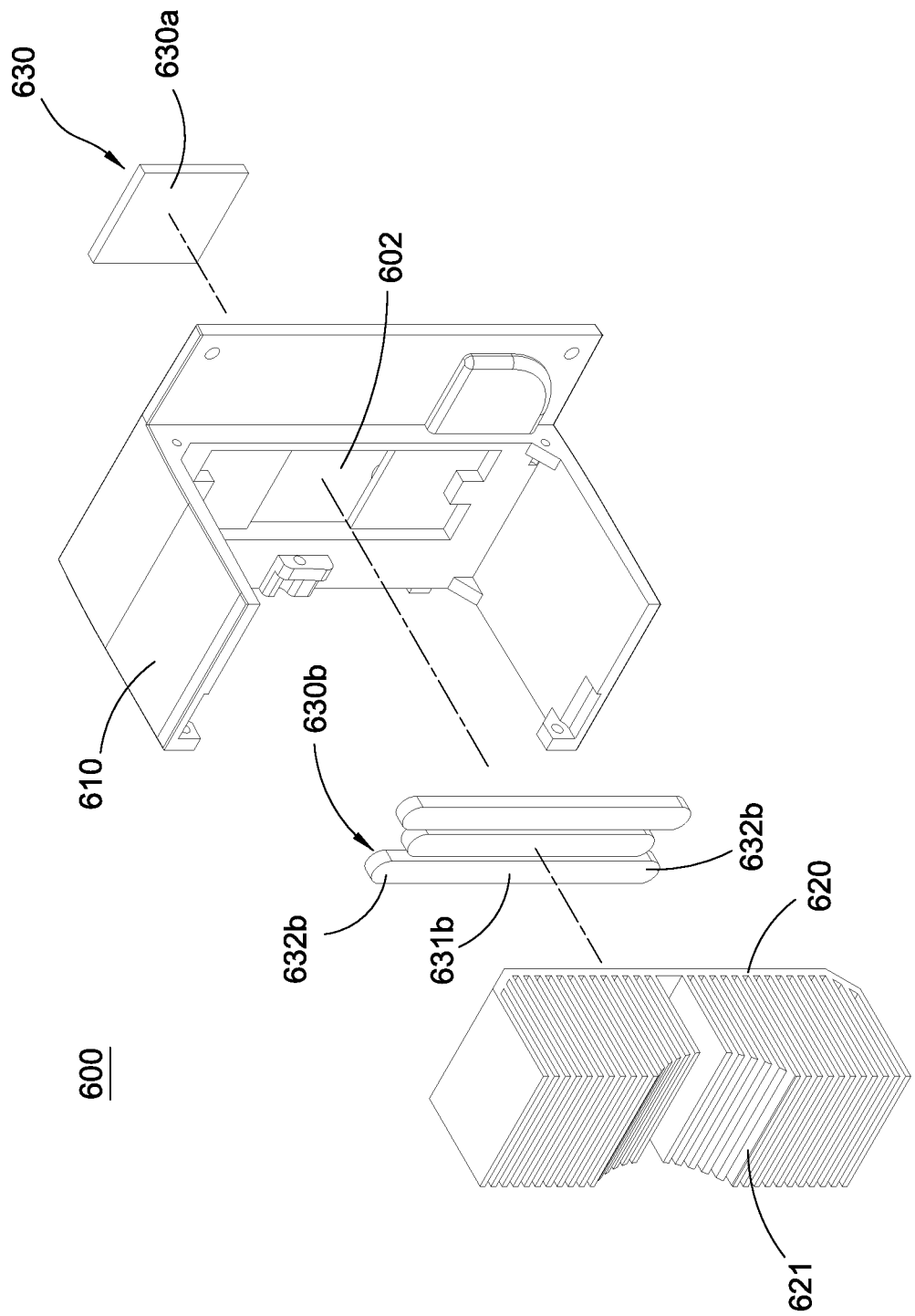
FIG. 5 is a perspective exploded view illustrating a heat transfer module of the inverter integrated motor according to the first embodiment of the present invention.
Figure 6:
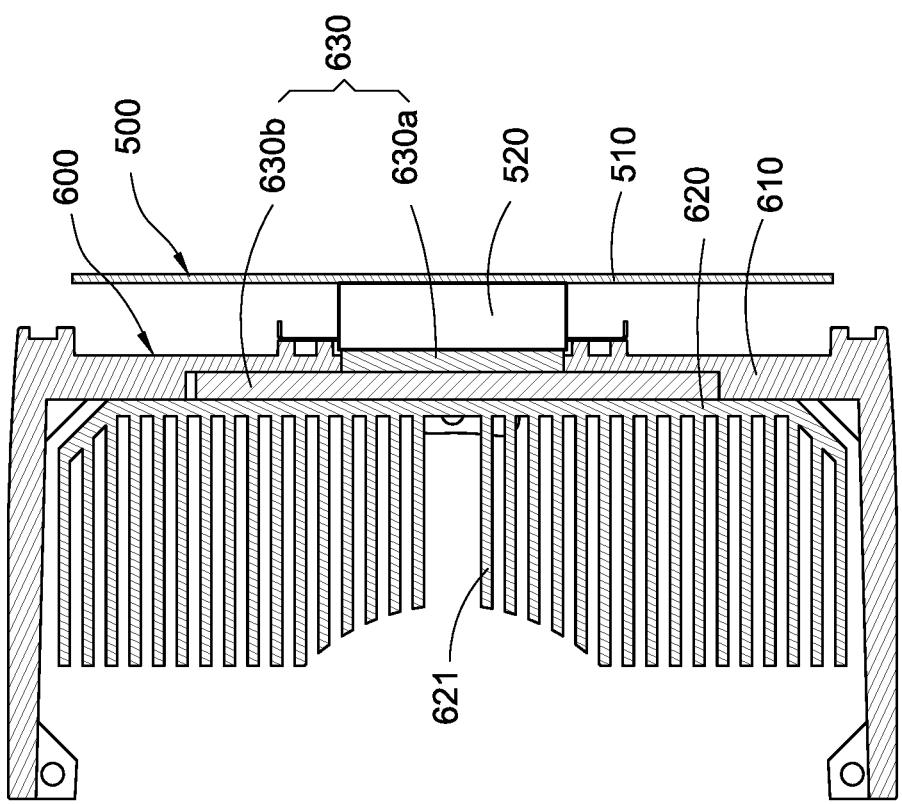
FIG. 6 is a schematic view illustrating a thermal connection configuration of the heat transfer module in the inverter integrated motor according to the first embodiment of the present invention.
Figure 6:

Referring to FIGS. 1 to 6, the present invention provides an inverter integrated motor. The inverter integrated motor includes a frame 100, a motor body 200, a cap 300, a fan 400, an inverter 500, and a heat transfer module 600.

In the present embodiment, the frame 100 is preferably a rectangular box with two open ends. One end of the frame 100 is used to connect a device (e.g. a pump, a compressor or a propeller) driven by the inverter integrated motor.

The motor body 200 is received in the frame 100. The motor body 200 includes a casing 210, a rotation shaft 220, a plurality of stators 230 and a plurality of rotors 240.

In the present embodiment, the casing 210 is preferably of cylindrical shape. The casing 210 is inserted in the frame 100, and two ends of the casing 210 are disposed correspondingly to two ends of the frame 100. At least one heat dissipation passage 201a/201b is formed inside the casing 210. In the present embodiment, the heat dissipation passage 201a of one portion is formed between the casing 210 and the frame 100 spaced apart from each other. The heat dissipation passage 201b of another portion is surrounded and formed by the casing 210. A plurality of fins 211 are extended from an outer side of the casing 210, and the fins 211 are spaced apart from each other and disposed inside the heat dissipation passage 201a outside the casing 210. A plurality of stators 230 on an inner surface of the casing 210 surround the rotation shaft 220. The stators 230 are in contact with the inner surface of the casing 210 and thermally connected to the fins 211 on the outer side of the casing 210. A rotation shaft 220 is inserted through the casing 210 and is disposed coaxially with respect to the casing 210. Two ends of the rotation shaft 220 form an output shaft 221 and a connection shaft 222 inserted through the casing 210. The output shaft 221 is used to output power. The rotors 240 surround the rotation shaft 220 and are attached onto the rotation shaft 220, and the stators 230 surround the rotors 240.

The cap 300 receives the connection shaft 222. The cap 300 covers and closes the casing 210. The cap 300 and the casing 210 are presented in a continuous form. The cap 300 is of conical shape, and the cap 300 is gradually tapered and extended from the housing 210 toward the fan 400.

The fan 400 is arranged on the connection shaft 222 and driven by the rotation shaft 220. The inverter 500 is disposed on an outer surface of the frame 100. The inverter 500 includes a motor control circuit board 510. A transistor 520 (an insulated gate bipolar transistor, i.e. IGBT for short) is disposed on the motor control circuit board 510.

The heat transfer module 600 is disposed between the cap 300 and the fan 400. The frame 100 and the heat transfer module 600 are presented in a continuous form. The heat transfer module 600 and the fan 400 are presented in a continuous form. The inverter 500, the frame 100 and the heat transfer module 600 are presented in a continuous form.

The heat transfer module 600 is thermally connected to the motor control circuit board 510. The transistor 520 is disposed corresponding to a position where the heat transfer module 600 is connected to the motor control circuit board 510.

The heat transfer module 600 includes an installation base 610 and a thermal conductive base 620. The installation base 610 is fixedly connected to the frame 100 and is disposed corresponding to one end of the connection shaft 222. The installation base 610 surrounds at least one portion of the cap 300. According to the present embodiment, the frame 100 surrounds a portion of the cap 300, and the installation base 610 surrounds another portion of the cap 300. The frame 100 and the installation base 610 are presented in a continuous form. An air compressing passage 601 communicating with the heat dissipation passage 201a/201b is formed between the cap 300 and the thermal conductive base 620. The air compressing passage 601 is gradually tapered and extended from the fan 400 toward the casing 210. The heat dissipation passage 201a/201b and the air compressing passage 601 are preferably presented in a continuous form. Airflow generated by the fan 400 passes through the gradually tapered air compressing passage 601 to speed up and then enter the heat dissipation passage 201a/201b, thus improving thermal convection efficiency between the airflow and the casing 210. The thermal conductive base 620 is disposed on an inner side of the installation base 610 and is arranged between the installation base 610 and the cap 300. The thermal conductive base 620 is directly or indirectly thermally connected to the motor control circuit board 510. In the present embodiment, the installation base 610 preferably has a through hole 602 penetrating through the same, so that the thermal conductive base 620 can be thermally connected to the motor control circuit board 510 via the through hole 602.

A plurality of fins 621 are extended from the thermal conductive base 620 to between the cap 300 and the fan 400 and are disposed inside the air compressing passage 601. The fins 621 are arranged parallel to each other in spaced-apart relationship. In the present embodiment, the fins 621 are separated from the cap 300. Preferably, a thermal break gap 603 is formed between an end portion of each of the fins 621 and the cap 300.

The heat transfer module 600 can selectively include a heat diffusion assembly 630. The heat diffusion assembly 630 is connected between the thermal conductive base 620 and the transistor 520. The heat diffusion assembly 630 extends along a surface of the thermal conductive base 620, so that heat of a point heat source constituted by the transistor 520 can be spread to everywhere on the thermal conductive base 620. This way, heat can be spread more evenly than heat is transmitted from the point heat source to the thermal conductive base 620 and spread by the thermal conductive base 620. The heat diffusion assembly 630 includes at least one heat pipe 630b. In the present embodiment, according the amount of heat generated by the transistor 520, the heat diffusion assembly 630 preferably includes three heat pipes 630b. The heat pipe 630b includes an evaporation section 631b, and the evaporation section 631b is exposed from the through hole 602 of the installation base 610. The transistor 520 is directly or indirectly thermally connected to the evaporation section 631b. In the present embodiment, the evaporation section 631b of the heat pipe 630b is a middle section of the heat pipe 630b. Two ends of the heat pipe 630b form two condensation section 632b, respectively. This way, heat can be transferred from the middle section of the heat pipe 630b to the two ends of the heat pipe 630b. The evaporation section 631b and the condensation section 632b are thermally connected to the thermal conductive base 620, so that the heat can be spread evenly and then transferred to the thermal conductive base 620, thus preventing the heat from being concentrated to the fins 621 corresponding to the heat source (the transistor 520). The present invention is not limited to any particular form of the heat diffusion assembly 630. In the present embodiment, the heat diffusion assembly 630 can also include a thermal diffusion plate 630a. The thermal diffusion plate 630a can be a metal sheet, and two sides of the metal sheet are connected to the thermal conductive base 620 and the transistor 520. In the present embodiment, two sides of the metal sheet can be directly connected to the heat pipe 630b and the transistor 520. Moreover, the thermal diffusion plate 630a can be a vapor chamber, and two sides of the vapor chamber are thermally connected to the thermal conductive base 620 and the transistor 520.

Heat from the motor control circuit board 510 is transferred via the heat transfer module 600 to between the cap 300 and the fan 400. The airflow generated by the fan 400 passes through the heat transfer module 600 and exchanges heat therewith, and then flows along an outer surface of the cap 300 to the heat dissipation passage 201a/201b. In the present embodiment, the heat transfer module 600 and the cap 300 are separated from each other. A thermal break gap 603 is formed between the heat transfer module 600 and the cap 300 to block transmission of heat to the cap 300. This way, heat can stay in an area having larger airflow around the air compressing passage 60. Furthermore, one side of the rotation shaft 220 opposite to the heat source can selectively include the fin 621 to increase a heat exchange area. In the present embodiment, the fins 621 of the heat transfer module 600 are disposed corresponding to the heat dissipation passage 201b of one portion. An end portion of each fin 621 extends but does not cross the rotation shaft 220 to reduce airflow resistance in the air compressing passage 601. It is preferable that the fins 211 on the casing 210 are disposed corresponding to the heat dissipation passage 201a of another portion, so that the fins 211 on the casing 210 are staggered from the fins 621 of the heat transfer module 600 in a passage formed by the heat dissipation chancel 201a/201b and the air compressing passage 601 communicating with each other. As a result, the airflow passes either the fins 211 on the casing 210 or the fins 621 of the heat transfer module, thereby reducing flow resistance and maintain evenly distributed air pressure along a circumferential direction in the air compressing passage 601. This prevents the airflow from rotatably hitting a surface of the fin 211/621 and causing an increase of the resistance. At the same time, a temperature difference between the airflow and the fins 211 on the casing 210 is increased to improve the heat exchange efficiency in a downstream part of the flow field.

Figure 7:
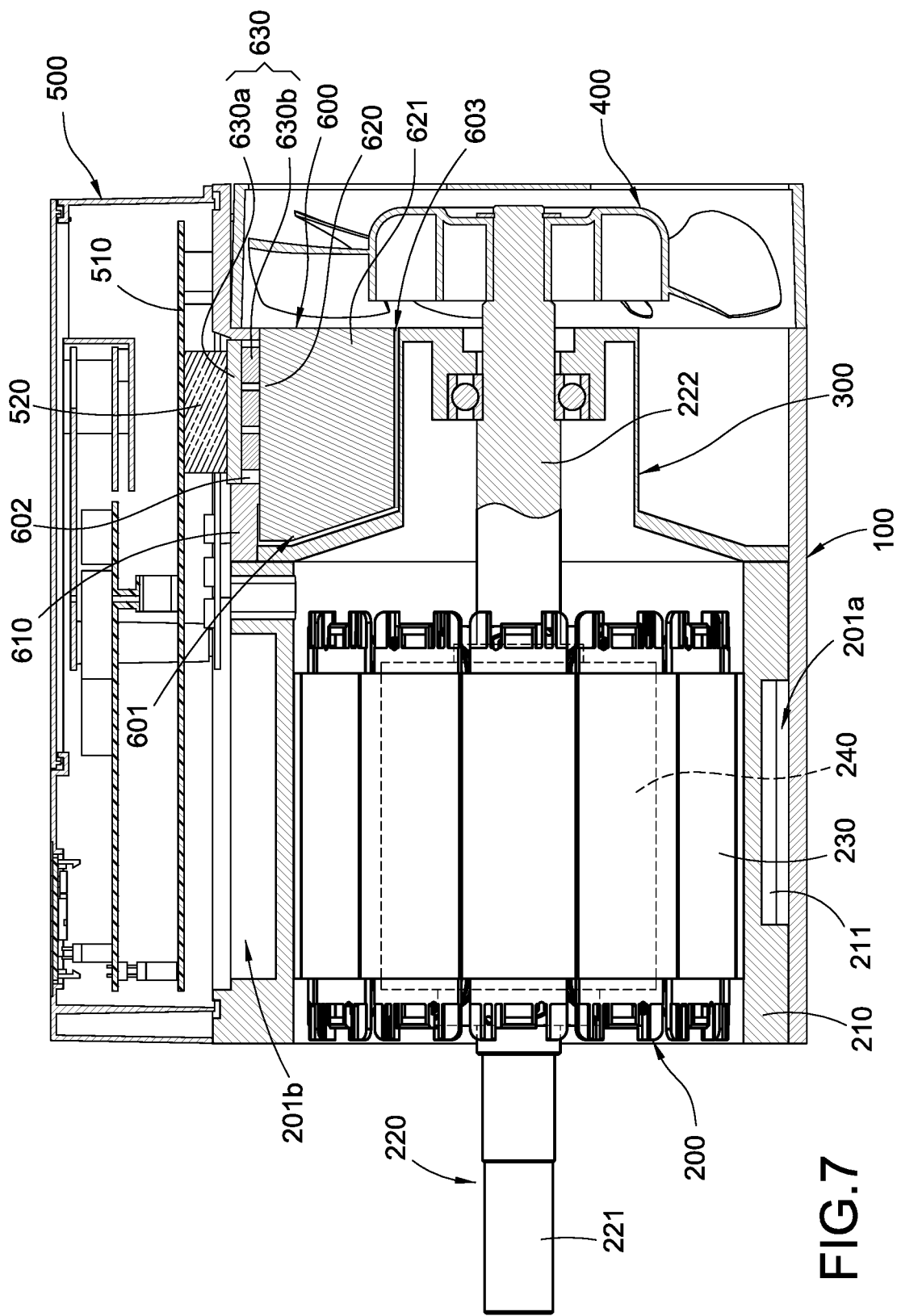
FIG. 7 is a schematic view illustrating another example of the inverter integrated motor according to the first embodiment of the present invention.

Referring to FIG. 7, each fin 621 of the heat transfer module 600 tapers and extends to fit the conical shape of the cap 300, thereby increasing the heat exchange area between the fins 621 and the airflow. In the present embodiment, the fins 211 on the casing 210 are used to dissipate the heat in the stator 230, so the fins 211 are arranged in a radially extending manner. The fins 621 of the heat transfer module 600 are used to direct the heat outside the frame 100 into the air compressing passage 601, so that the fins 621 of the heat transfer module 600 are arranged parallel to each other for efficient heat transfer. The fins 211 on the casing 210 are separated from the fins 621 of the heat transfer module 600 to thereby reduce flow resistance when airflow passes the fins 211/621 of different configurations. However, the present invention is not limited in this regard, which means the fins 211 on the casing 210 can extend in parallel relation to each other and can extend further to connect the fins 621 of the heat transfer module 600.

Figure 8:
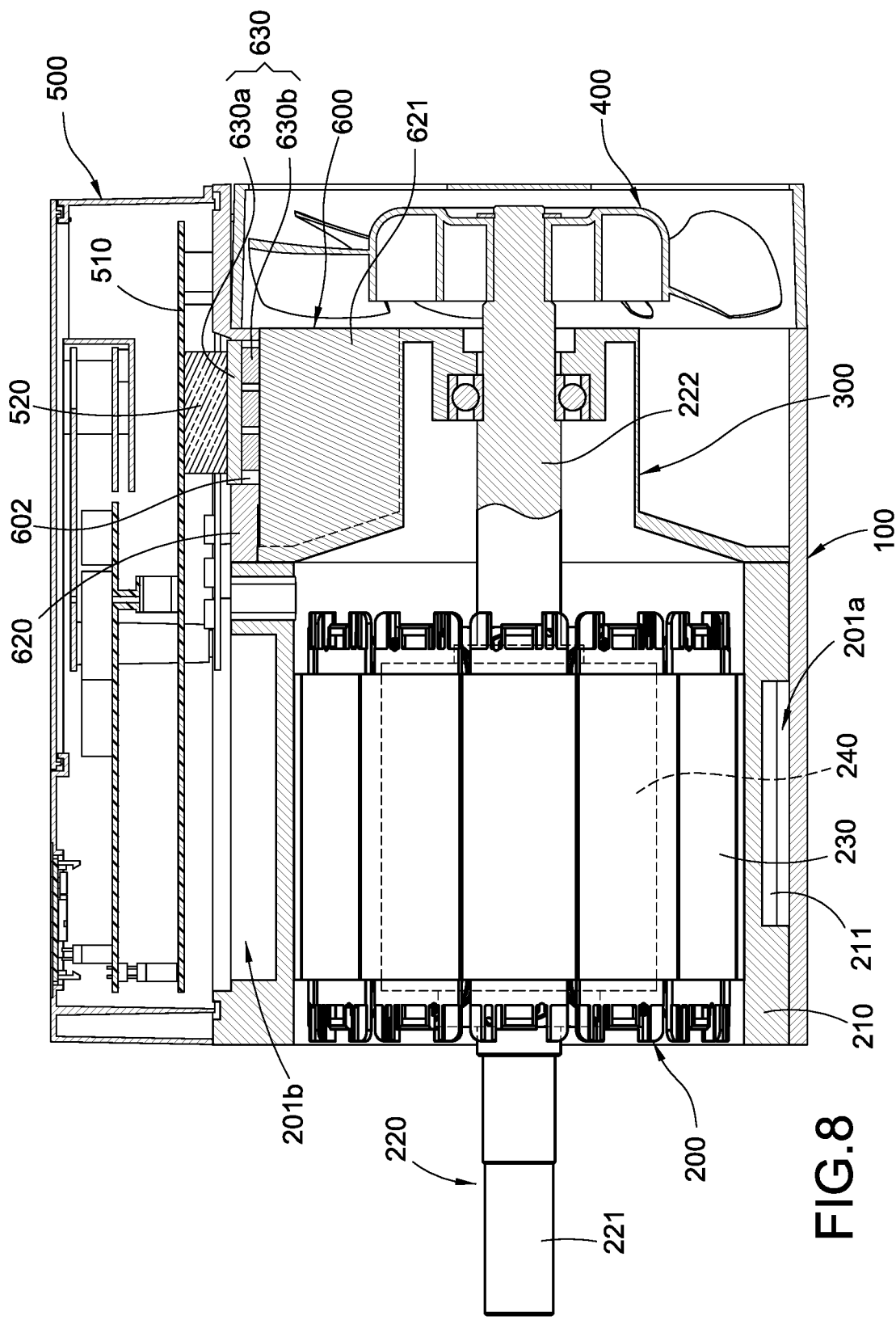
FIGS. 8 and 9 are schematic views illustrating the inverter integrated motor according to the second embodiment of the present invention.
Figure 9:
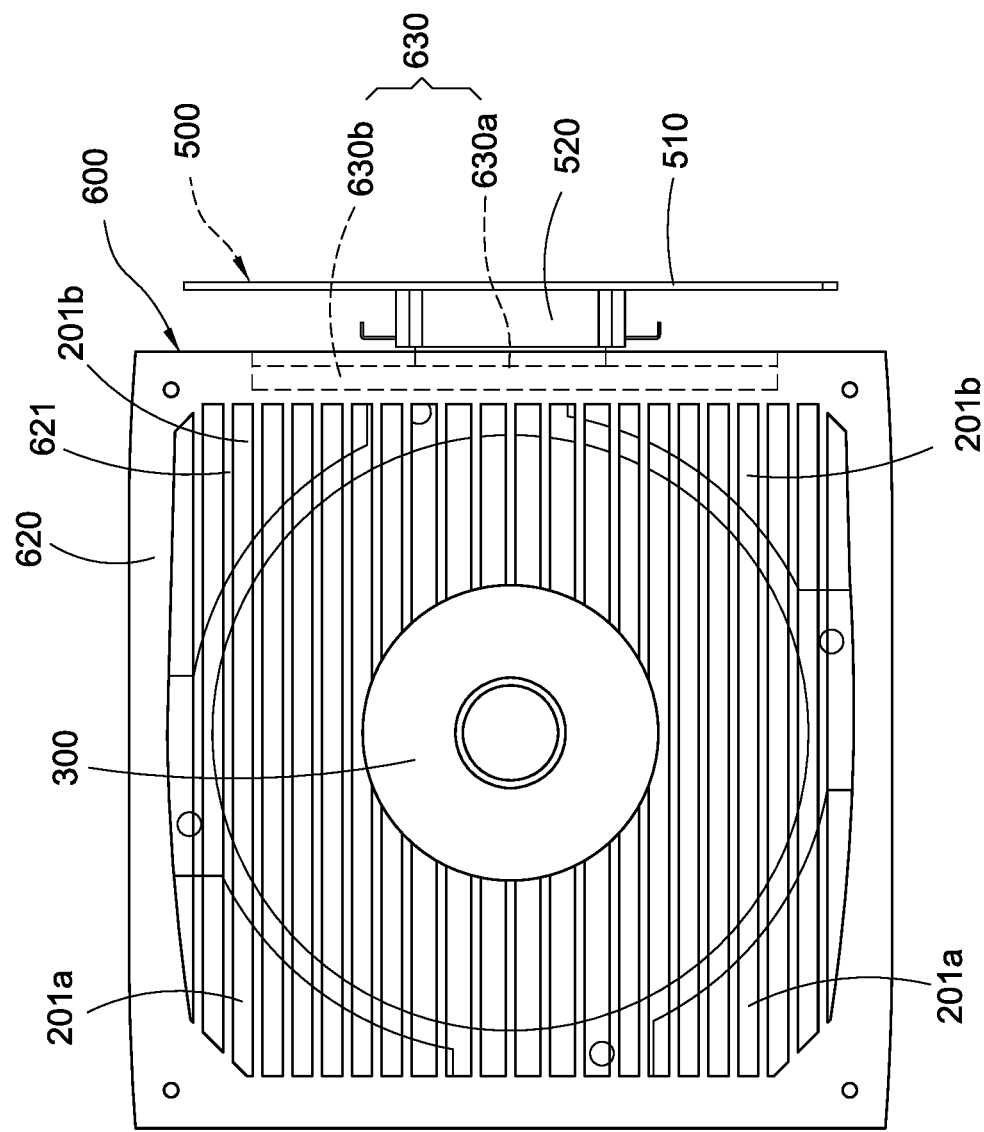

Please refer to FIGS. 8 and 9 for an inverter integrated motor according to the second embodiment of the present invention. The inverter integrated motor includes a frame 100, a motor body 200, a cap 300, a fan 400, an inverter 500, and a heat transfer module 600. The frame 100, the motor body 200, the fan 400 and the inverter 500 are the same as those in the first embodiment, so a detailed description thereof is omitted herein for brevity. The second embodiment is different from the first embodiment in that the heat transfer module 600 and the cap 300 are integrally connected to each other.

The heat transfer module 600 includes a thermal conductive base 620 connected to the frame 100 and thermally connected to the motor control circuit board 510. The heat transfer module 600 also includes a plurality of fins 621 extended from the thermal conductive base 620 to between the cap 300 and the fan 400. At least a portion of fins 621 of the heat transfer module 600 are extended from the thermal conductive base 620 to the cap 300 and are integrally connected to the cap 300. The fins 621 surround the rotation shaft 220. The fins 621 of the heat transfer module 600 gradually tapers and extends to fit the conical shape of the cap 300, thus not only increasing in a limited space the heat exchange area between the fins 621 and the airflow, but also preventing formation of a recessed breach between the heat transfer module 600 and the cap 300, and consequently efficient manufacturing can be achieved.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An inverter integrated motor, comprising:
a frame, including a base plate, and a first vertical wall and a second vertical wall being arranged upright on the base plate and opposite to each other;
a motor body received in the frame, the motor body including a casing and a rotation shaft inserted through the casing, the casing includes a protrusion portion and a plurality of motor fins, the motor fins being disposed on an outer surface of the casing and at an outside of the protrusion portion, the frame covers the casing and the motor fins along a radial direction of the rotation shaft corresponding to the protrusion portion, the first vertical wall and the second vertical wall respectively attach the protrusion portion to form a first heat dissipation passage, a second heat dissipation passage being defined through the protrusion portion, an internal surface of the second heat dissipation passage being flat and the second heat dissipation passage being communicated with the first heat dissipation passage;

a cap receiving the rotation shaft, the cap covers an end surface of the casing, the cap has a conical extending portion converged from the end surface toward the rotation shaft and a receiving portion connected to the conical extending portion, the receiving portion being cylindrical and the rotation shaft is outward protruded from an end surface of the receiving portion;

a fan arranged on the rotation shaft and outside of the cap;

an inverter disposed on an external surface of the protrusion portion, the inverter including a motor control circuit board; and a heat transfer module disposed corresponding to the motor control circuit board and thermally connected to the motor control circuit board, the heat transfer module includes an installation base, a thermal conductive base and a heat diffusion assembly, the installation base being of a U shape, the installation base has two side surfaces respectively attaching the protrusion portion and the frame, the installation base and the frame laterally cover the receiving portion and the conical extending portion according to the radial direction of the rotation shaft, a first air compressing passage being formed by the frame and a part of external surfaces of the conical extending portion and the receiving portion covered by the frame, the first air compressing passage being communicated to the first heat dissipation passage, the thermal conductive base being arranged in the installation base and partially coves the receiving portion, the thermal conductive base has a plurality of first fins upright extended and arranged at interval, a second air compressing passage being formed by the installation base and another part of external surfaces of the conical extending portion and the receiving portion covered by the installation base, the second air compressing passage being communicated to the second heat dissipation passage, a containing volume of the first air compressing passage being larger than a containing volume of the second air compressing passage, the heat diffusion assembly being clamped between the installation base and the thermal conductive base, and the heat diffusion assembly transfers heat to the first fins from the motor control circuit board wherein an airflow is driven by the fan, the airflow cools the motor fins and the motor body when flows through the first air compressing passage into the first heat dissipation passage, the airflow cools the first fins and the motor body when flows through the second air compressing passage into the second heat dissipation passage.

2. The inverter integrated motor according to claim 1, wherein the heat transfer module and the cap are integrally formed.

3. The inverter integrated motor according to claim 1, wherein the heat transfer module and the cap are separated from each other, and a thermal break gap is formed between the heat transfer module and the cap.

4. The inverter integrated motor according to claim 1, wherein the first fins are arranged parallel to each other in spaced-apart relationship.

5. The inverter integrated motor according to claim 1, wherein the first fins are gradually tapered and extended to fit a shape of the cap.

6. The inverter integrated motor according to claim 1, wherein the first fins are extended toward the rotation shaft from a side of the rotation shaft, and an end portion of each of the first fins is extended without crossing the rotation shaft.

7. The inverter integrated motor according to claim 1, wherein the first fins surround the rotation shaft.

8. The inverter integrated motor according to claim 1, wherein the first fins are extended to the cap and integrally connected to the cap.

9. The inverter integrated motor according to claim 1, wherein each of the first fins is separated from the cap, and a thermal break gap is formed between an end portion of each of the first fins and the cap.

10. The inverter integrated motor according to claim 1, wherein a transistor is disposed on the motor control circuit board, and the transistor is disposed corresponding to a position where the heat transfer module is connected to the motor circuit board.

11. The inverter integrated motor according to claim 10, wherein the heat transfer module includes a heat diffusion assembly, the heat diffusion assembly is connected between the thermal conductive base and the transistor, and the heat diffusion assembly extends along a surface of the thermal conductive base.

12. The inverter integrated motor according to claim 11, wherein the heat diffusion assembly includes a metal sheet, and two sides of the metal sheet are connected to the thermal conductive base and the transistor.

13. The inverter integrated motor according to claim 11, wherein the heat diffusion assembly includes a vapor chamber, two sides of the vapor chamber are connected to the thermal conductive base and the transistor.

14. The inverter integrated motor according to claim 11, wherein the heat diffusion assembly includes a heat pipe, the heat pipe includes an evaporation section, and the transistor is thermally connected to the evaporation section.

15. The inverter integrated motor according to claim 14, wherein the evaporation section of the heat pipe is a middle section of the heat pipe, two ends of the heat pipe form two condensation sections respectively, and the condensation sections are thermally connected to the thermal conductive base.

16. The inverter integrated motor according to claim 1, wherein the motor fins of the casing are spaced apart from each other and disposed inside the second heat dissipation passage.

17. The inverter integrated motor according to claim 16, wherein the fan is an axial fan.

18. The inverter integrated motor according to claim 16, wherein a plurality of stators inside the casing surround the rotation shaft, and the stators are in contact with an inner surface of the casing and thermally connected to the motor fins on the outer side of the casing.

* * * * *